US009410242B2

(12) United States Patent
Scarsbrook et al.

(10) Patent No.: US 9,410,242 B2
(45) Date of Patent: Aug. 9, 2016

(54) MICROWAVE PLASMA REACTOR FOR MANUFACTURING SYNTHETIC DIAMOND MATERIAL

(75) Inventors: Geoffrey Alan Scarsbrook, Ascot (GB); Jonathan James Wilman, Ascot (GB); Helen Wilman, legal representative, Ascot (GB); Joseph Michael Dodson, Ascot (GB); John Robert Brandon, Ascot (GB); Steven Edward Coe, Ascot (GB); Christopher John Howard Wort, Ascot (GB)

(73) Assignee: Element Six Technologies Limited, Didcot (GB)

( * ) Notice: Subject to any disclaimer, the term of this patent is extended or adjusted under 35 U.S.C. 154(b) by 92 days.

(21) Appl. No.: 13/980,452

(22) PCT Filed: Dec. 14, 2011

(86) PCT No.: PCT/EP2011/072821
§ 371 (c)(1),
(2), (4) Date: Oct. 29, 2013

(87) PCT Pub. No.: WO2012/084657
PCT Pub. Date: Jun. 28, 2012

(65) Prior Publication Data
US 2014/0048016 A1 Feb. 20, 2014

Related U.S. Application Data

(60) Provisional application No. 61/439,247, filed on Feb. 3, 2011.

(30) Foreign Application Priority Data
Dec. 23, 2010 (GB) .................................. 1021853.5

(51) Int. Cl.
C23C 16/00 (2006.01)
C23F 1/00 (2006.01)
(Continued)

(52) U.S. Cl.
CPC ............... *C23C 16/274* (2013.01); *C01B 31/06* (2013.01); *C23C 16/511* (2013.01);
(Continued)

(58) Field of Classification Search
USPC .............................. 118/723 MW; 156/345.41
See application file for complete search history.

(56) References Cited

U.S. PATENT DOCUMENTS 4,869,923 A 9/1989 Yamazaki
4,989,542 A 2/1991 Kamo
(Continued)

FOREIGN PATENT DOCUMENTS

CN 101385129 3/2009
EP 0343602 A3 11/1989
(Continued)

OTHER PUBLICATIONS

Balmer et al., Chemical vapour deposition synthetic diamond: materials, technology and applications, Journal of Physics: Condensed Matter, 21, 2009.

(Continued)

*Primary Examiner* — Rakesh Dhingra
(74) *Attorney, Agent, or Firm* — Dean W. Russell; Clark F. Weight; Kilpatrick Townsend & Stockton LLP

(57) ABSTRACT

A microwave plasma reactor for manufacturing synthetic diamond material via chemical vapour deposition, the microwave plasma reactor comprising:
 a plasma chamber;
 a substrate holder disposed in the plasma chamber and comprising a supporting surface for supporting a substrate on which the synthetic diamond material is to be deposited in use;
 a microwave coupling configuration for feeding microwaves from a microwave generator into the plasma chamber; and
 a gas flow system for feeding process gases into the plasma chamber and removing them therefrom;
 wherein the microwave plasma reactor further comprises an electrically conductive plasma stabilizing annulus disposed around the substrate holder within the plasma chamber.

19 Claims, 4 Drawing Sheets

(51) Int. Cl.
| | |
|---|---|
| *H01L 21/306* | (2006.01) |
| *C23C 16/27* | (2006.01) |
| *C23C 16/511* | (2006.01) |
| *C30B 25/10* | (2006.01) |
| *C30B 29/04* | (2006.01) |
| *H01J 37/32* | (2006.01) |
| *C01B 31/06* | (2006.01) |

(52) U.S. Cl.
CPC .............. *C30B 25/105* (2013.01); *C30B 29/04* (2013.01); *H01J 37/32192* (2013.01); *H01J 37/32642* (2013.01); *H01J 2237/339* (2013.01)

(56) References Cited

U.S. PATENT DOCUMENTS

| | | | |
|---|---|---|---|
| 5,091,208 A | 2/1992 | Pryor | |
| 5,258,206 A | 11/1993 | Hayashi et al. | |
| 5,261,959 A | 11/1993 | Gasworth | |
| 5,273,731 A | 12/1993 | Anthony et al. | |
| 5,273,790 A | 12/1993 | Herb et al. | |
| 5,302,226 A | 4/1994 | Yamazaki et al. | |
| 5,302,803 A | 4/1994 | Stevens et al. | |
| 5,311,103 A | 5/1994 | Asmussen et al. | |
| 5,370,912 A * | 12/1994 | Bigelow et al. | 427/575 |
| 5,397,396 A | 3/1995 | Kosky et al. | |
| 5,432,315 A * | 7/1995 | Kaji et al. | 219/121.43 |
| 5,501,740 A | 3/1996 | Besen et al. | |
| 5,520,771 A * | 5/1996 | Kanai et al. | 156/345.41 |
| 5,643,365 A | 7/1997 | Blinov et al. | |
| 5,683,759 A | 11/1997 | Shepard, Jr. et al. | |
| 5,951,887 A * | 9/1999 | Mabuchi et al. | 219/121.43 |
| 5,981,057 A | 11/1999 | Collins | |
| 6,091,045 A | 7/2000 | Mabuchi et al. | |
| 6,106,678 A | 8/2000 | Shufflebotham et al. | |
| 6,132,550 A * | 10/2000 | Shiomi | 156/345.41 |
| 6,158,383 A | 12/2000 | Watanabe et al. | |
| 6,245,190 B1 * | 6/2001 | Masuda et al. | 156/345.46 |
| 6,254,683 B1 | 7/2001 | Matsuda et al. | |
| 6,319,439 B1 | 11/2001 | Lee et al. | |
| 6,325,018 B1 | 12/2001 | Hongoh | |
| 6,388,632 B1 | 5/2002 | Murakawa et al. | |
| 6,414,338 B1 | 7/2002 | Anderson | |
| 6,427,621 B1 | 8/2002 | Ikegawa et al. | |
| 6,433,298 B1 | 8/2002 | Ishii | |
| 6,487,986 B1 | 12/2002 | Liehr et al. | |
| 6,565,661 B1 | 5/2003 | Nguyen | |
| 6,645,343 B1 | 11/2003 | Wild et al. | |
| 2001/0023663 A1 | 9/2001 | Kazumi et al. | |
| 2001/0036465 A1 | 11/2001 | Ishll et al. | |
| 2001/0050059 A1 * | 12/2001 | Hongo et al. | 118/723 MW |
| 2002/0084034 A1 * | 7/2002 | Kofuji et al. | 156/345.48 |
| 2003/0107003 A1 | 6/2003 | Whitehead | |
| 2003/0150561 A1 | 8/2003 | Ishii et al. | |
| 2003/0150846 A1 | 8/2003 | Ishii et al. | |
| 2003/0200914 A1 | 10/2003 | Noguchi et al. | |
| 2004/0045674 A1 | 3/2004 | Ishii et al. | |
| 2005/0005853 A1 | 1/2005 | Behle et al. | |
| 2005/0109267 A1 | 5/2005 | Linares et al. | |
| 2005/0266606 A1 | 12/2005 | Chevallier et al. | |
| 2006/0266279 A1 | 11/2006 | Mokuno et al. | |
| 2007/0163996 A1 | 7/2007 | Horiguchi | |
| 2007/0221294 A1 | 9/2007 | Sasaki | |
| 2007/0264441 A1 * | 11/2007 | Ishibashi et al. | 427/488 |
| 2008/0099768 A1 | 5/2008 | Scarsbrook et al. | |
| 2008/0156256 A1 | 7/2008 | Linares et al. | |
| 2008/0190356 A1 | 8/2008 | Bhandari | |
| 2008/0303744 A1 | 12/2008 | Hirayama et al. | |
| 2010/0028556 A1 | 2/2010 | Linares et al. | |
| 2010/0034984 A1 | 2/2010 | Asmussen et al. | |
| 2010/0178234 A1 | 7/2010 | Noguchi | |
| 2010/0189924 A1 | 7/2010 | D'Evelyn et al. | |

FOREIGN PATENT DOCUMENTS

| | | |
|---|---|---|
| EP | 0390209 A3 | 10/1990 |
| EP | 0447031 A1 | 9/1991 |
| EP | 0480581 | 9/1991 |
| EP | 0467043 A2 | 1/1992 |
| EP | 0487292 A1 | 5/1992 |
| EP | 0526657 A1 | 2/1993 |
| EP | 0546752 A1 | 6/1993 |
| EP | 0582397 A2 | 2/1994 |
| EP | 0597445 A2 | 5/1994 |
| EP | 0695816 A1 | 2/1996 |
| EP | 0727507 A2 | 8/1996 |
| EP | 0758688 A1 | 2/1997 |
| EP | 0822269 | 4/1998 |
| EP | 1500718 A1 | 1/2005 |
| EP | 1643641 A2 | 4/2006 |
| EP | 1463849 | 1/2007 |
| EP | 2108714 A1 | 10/2009 |
| FR | 2798552 | 3/2001 |
| JP | S62162366 A | 7/1987 |
| JP | S62167886 A | 7/1987 |
| JP | S62235393 A | 10/1987 |
| JP | 03281594 C2 | 12/1991 |
| JP | 4009471 A | 1/1992 |
| JP | 4-228495 A | 8/1992 |
| JP | H04238896 | 8/1992 |
| JP | H05013342 A | 1/1993 |
| JP | H061251158 A | 9/1994 |
| JP | H08133893 A | 5/1996 |
| JP | 2001007385 | 1/2001 |
| JP | 2002265296 A | 3/2001 |
| JP | 2003045810 A | 2/2003 |
| JP | 2003-142471 A | 5/2003 |
| JP | 2004235434 A | 8/2004 |
| JP | 2004244298 A | 9/2004 |
| JP | 2005-044822 A | 2/2005 |
| JP | 2007142195 | 6/2007 |
| JP | 2007273913 A | 10/2007 |
| JP | 2007284773 A | 11/2007 |
| JP | 2007331955 A | 12/2007 |
| JP | 2006286269 A | 5/2008 |
| JP | 2009280421 A | 12/2009 |
| KR | 20020061768 A | 7/2002 |
| SE | 500740 C2 | 8/1994 |
| WO | 02/077319 A1 | 10/2002 |
| WO | 03/040440 A2 | 5/2003 |
| WO | 2006/011756 A1 | 2/2006 |
| WO | 2006/117621 | 11/2006 |
| WO | 2006/127611 A2 | 11/2006 |
| WO | 2007/092893 A2 | 8/2007 |
| WO | 2008/025899 | 3/2008 |
| WO | 2008/029258 | 3/2008 |
| WO | 2008/090510 | 7/2008 |
| WO | 2008/123605 A1 | 10/2008 |
| WO | 2010/004836 A1 | 1/2010 |
| WO | 2010/021382 A1 | 2/2010 |
| WO | 2010/084655 | 7/2010 |

OTHER PUBLICATIONS

Whitfield et al., Nucleation and growth of diamond films on single crystal and polycrystalline tungsten substrates, Diamond and Related Materials, vol. 9, pp. 262-268, 2000.

International Search Report issued on PCT/EP2011/072824, dated May 3, 2012.

Silva et al., Microwave Analysis of PACVD diamond deposition reactor based on electromagnetic materials, Diamond & Related Materials, vol. 19, pp. 397-403, 2010.

Search Report issued on GB1121517.5, dated Mar. 27, 2012.

Funer et al., Simulation and development of optimized microwave plasma reactors for diamond deposition, Surface and Coatings Technology, 1999, 853-862, vol. 116-119.

Hassouni et al., Self-consistent microwave field and plasma discharge simulations for a moderate pressure hydrogen discharge reactor, Journal of Applied Physics, 1999, pp. 134-151, 86(1).

Search Report issued on GB1021913.7, dated Apr. 21, 2011.

(56) References Cited

OTHER PUBLICATIONS

Kosky et al., Fracture-free release of CVD diamond, Diamond and Related Materials 5 (1996) pp. 1313-1317.
Asmussen, et al., Multiple substrate microwave plasma-assisted chemical vapor deposition single crystal diamond syntheses, Applied Physics Letters, p. 93, 031502, 2008.
Chae, et al., The 8-inch free-standing CVD diamond wafer fabricated by DC-PACVD, Diamond and Related Materials, 19, 2010, pp. 1168-1171.
Gray, et al., Free-standing CVD diamond wafers for thermal management by d.c. arc jet technology, Diamond and Related Materials 8, 1999, 903-908.
Liao, Samuel Y., Microwave Devices and Circuits, 3d Edition, published by Prentice-Hall, Inc., New Jersey pp. 144-156.
Hassouni et la., Modelling of diamond deposition microwave cavity generated plasmas, J. Phys. D. Appl. Phys,. 43 (2010) 153001.
Hemawan, et a., Improved microwave plasma cavity reactor for diamond synthesis at high-pressure and high power density, Diamond & Related Materials 19 (2010) 1446-1452.
Alam et al., Adhesion of diamond coatings on tungsten substrates, Journal of Adhesion Science and Technology, vol. 9, No. 6, 1995 Netherlands, 653-679.
Feng, et al., Surface stress measurement with interference microscopy of thick homoepitaxial single-crystal diamond layers, Diamond & Related Materials 19 (2010) 1453-1456.
Yamada, Simulation with an improved plasma model utilized to design a new structure of microwave plasma dischage for chemical vapor deposition of diamond crystals, Diamond and Related Materials, 17, Issues 4-5 (2008), pp. 494-497.
Achard, J., et al., Thick boron doped diamond single crystals for high power electronics, Diamond & Related Materials, 20, pp. 145-152, 2010.
Lee, et al., Single-cathode DC PACVD process for large-area CVD diamond wafer fabrication, 203rd Meeting of the Electrochemical Society, Eighth International Symposium on Diamond Materials, 2003.
Funer et al., Numerical simulations of microwave plasma reactor for diamond CVD, Surface and Coatings Technology, 74-75 (1995), pp. 221-226.
International Search Report issued on PCT/EP2011/072820, dated Mar. 30, 2012.
Search Report issued on GB1121474.9, dated Mar. 27, 2012.
Search Report issued on GB1305030.7 dated Apr. 16, 2013.
Search Report issued on GB1305041.4 dated Apr. 15, 2013.
Search Report issued on GB1305045.5 dated Apr. 16, 2013.
Search Report issued on GB1121486.3 dated Apr. 12, 2012.
Search Report issued on GB1021870.9 dated Apr. 6, 2011.
Search Report issued on GB1021865.9 dated Apr. 20, 2011.
Search Report issued on GB1121494.7 dated Apr. 7, 2012.
Search Report issued on GB1021860.0 dated Apr. 20, 2011.
Search Report issued on GB1121492.1 dated Apr. 12, 2012.
Search Report issued on GB1021855.0 dated May 31, 2011.
Search Report issued on GB1121499.6 dated Jan. 27, 2012.
Search Report issued on GB1121505.0 dated Mar. 29, 2012.
International Search Report issued on PCT/EP2011/072825 dated Mar. 30, 2012.
Search Report issued on GB1021853.5 dated Mar. 30, 2011.
International Search Report issued on PCT/EP2011/072823, dated Jul. 4, 2012.
International Search Report issued on PCT/EP2011/072822, dated May 23, 2012.
International Search Report issued on PCT/EP2011/072818, dated Jun. 22, 2012.
International Search Report issued on PCT/EP2011/072821, dated Mar. 2, 2012.
Silva, F., et al., Microwave engineering of plasma-assisted CVD reactors for diamond deposition, Journal of Physics; Condensed Matter, vol. 21, No. 364202, 2009.
Nagatsu et al., "Diagnostics of plasma ball formed in high pressure microwave plasma for diamond film synthesis", Diamond and Related Materials, 2002; pp. 562-566.
http://web.archive.org/web/20501090953/http://en.wikipedia.org/wiki/Aluminum.

* cited by examiner

MICROWAVE PLASMA REACTOR FOR MANUFACTURING SYNTHETIC DIAMOND MATERIAL

FIELD OF INVENTION

The present invention relates to a microwave plasma reactor for manufacturing synthetic diamond material using chemical vapour deposition techniques.

BACKGROUND OF INVENTION

Chemical vapour deposition (CVD) processes for manufacture of synthetic diamond material are now well known in the art. Useful background information relating to the chemical vapour deposition of diamond materials may be found in a special issue of the Journal of Physics: Condensed Matter, Vol. 21, No. 36 (2009) which is dedicated to diamond related technology. For example, the review article by R. S Balmer et al. gives a comprehensive overview of CVD diamond materials, technology and applications (see "Chemical vapour deposition synthetic diamond: materials, technology and applications" J. Phys.: Condensed Matter, Vol. 21, No. 36 (2009) 364221).

Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, diamond can be deposited.

Atomic hydrogen is essential to the process because it selectively etches off non-diamond carbon from the substrate such that diamond growth can occur. Various methods are available for heating carbon containing gas species and molecular hydrogen in order to generate the reactive carbon containing radicals and atomic hydrogen required for CVD diamond growth including arc-jet, hot filament, DC arc, oxy-acetylene flame, and microwave plasma.

Methods that involve electrodes, such as DC arc plasmas, can have disadvantages due to electrode erosion and incorporation of material into the diamond. Combustion methods avoid the electrode erosion problem but are reliant on relatively expensive feed gases that must be purified to levels consistent with high quality diamond growth. Also the temperature of the flame, even when combusting oxy-acetylene mixes, is insufficient to achieve a substantial fraction of atomic hydrogen in the gas stream and the methods rely on concentrating the flux of gas in a localized area to achieve reasonable growth rates. Perhaps the principal reason why combustion is not widely used for bulk diamond growth is the cost in terms of kWh of energy that can be extracted. Compared to electricity, high purity acetylene and oxygen are an expensive way to generate heat. Hot filament reactors while appearing superficially simple have the disadvantage of being restricted to use at lower gas pressures which are required to ensure relatively effective transport of their limited quantities of atomic hydrogen to a growth surface.

In light of the above, it has been found that microwave plasma is the most effective method for driving CVD diamond deposition in terms of the combination of power efficiency, growth rate, growth area, and purity of product which is obtainable.

A microwave plasma activated CVD diamond synthesis system typically comprises a plasma reactor vessel coupled both to a supply of source gases and to a microwave power source. The plasma reactor vessel is configured to form a resonance cavity supporting a standing microwave. Source gases including a carbon source and molecular hydrogen are fed into the plasma reactor vessel and can be activated by the standing microwave to form a plasma in high field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

A range of possible microwave plasma reactors for diamond film growth via a chemical vapour deposition (CVD) process are known in the art. Such reactors have a variety of different designs. Common features include: a plasma chamber; a substrate holder disposed in the plasma chamber; a microwave generator for forming the plasma; a coupling configuration for feeding microwaves from the microwave generator into the plasma chamber; a gas flow system for feeding process gases into the plasma chamber and removing them therefrom; and a temperature control system for controlling the temperature of a substrate on the substrate holder.

A useful overview article by Silva et al. summarizing various possible reactor designs is given in the previous mentioned Journal of Physics (see "Microwave engineering of plasma-assisted CVD reactors for diamond deposition" J. Phys.: Condens. Matter, Vol. 21, No. 36 (2009) 364202). This article identifies that from a purely electromagnetic standpoint, there are three main design criteria: (i) the choice of the resonant mode; (ii) the choice of the coupling structure (electric or magnetic); and (iii) the choice of dielectric window (shape and location).

Having regard to point (i), Silva et al. identify that transverse magnetic (TM) modes, and particularly cylindrical $TM_{0mn}$ modes, are most suitable. In this notation, the first index number (here 0) indicates that the electric field structure is axisymmetric, which will yield a circular plasma. The indices m and n represent the number of nodes in the electric field in the radial and axial directions, respectively. Silva et al indicate that a number of different modes have been used in prior art reactors including: $TM_{011}$; $TM_{012}$; $TM_{013}$; $TM_{020}$; $TM_{022}$; $TM_{023}$; and $TM_{031}$.

Having regard to point (ii), Silva et al. identify that electric field (capacitive) coupling using an antenna is the most widely used and that magnetic (inductive) coupling is rarely used because of the limited power than can be coupled. That said, a commercially available IPLAS reactor is disclosed as using magnetic coupling to support a $TM_{012}$ mode.

Having regard to point (iii), Silva et al. describe that an essential element associated with both electric and magnetic coupling schemes is a dielectric window which is generally made of quartz and delimits a reduced pressure zone inside the cavity in which reactant gases are fed to form a plasma when excited by the electromagnetic field. It is described that the use of a quartz window allows a user to select a single electric field anti-node region (of maximum electric field) such that the plasma can be ignited only in this region and the formation of parasitic plasma at other electric field maxima within the chamber can be avoided. The quartz window is conventionally in the form of a bell-jar placed over the substrate on which deposition is to occur and around the electric field anti-node located adjacent the substrate. Other dielectric window configurations are also disclosed. For example, an ASTEX reactor is described which includes a dielectric window in the form of a plate located across the reactor chamber approximately at the cavity mid-plane while a second-generation ASTEX reactor is described as having a dielectric window in the form of a quartz tube which is not directly exposed to the plasma so as to give the reactor better power handling capabilities.

In addition, the article discloses various geometries of prior art reactor chambers including: a cylindrical chamber such the MSU reactor which is designed to support a $TM_{012}$ mode, the ASTEX reactor which is designed to support a $TM_{013}$ mode, or LIMHP reactor designs supporting a $TM_{023}$ mode or a $TM_{022}$ mode; an ellipsoidal chamber such as the AIXTRON reactor; and other non-cylindrical chambers such as the second generation ASTEX reactor which has a central cylindrical component purported to support a $TM_{011}$ mode and laterally extending side lobes supporting a $TM_{021}$ mode. In fact, the second generation ASTEX reactor has only one $E_z$-field maximum in the upper part of the central section of the chamber which is the case for a $TM_{011}$ mode, but two $E_z$ maxima in its lower half, as expected for a $TM_{021}$ mode.

Having regard to the patent literature, U.S. Pat. No. 6,645,343 (Fraunhofer) discloses an example of a microwave plasma reactor configured for diamond film growth via a chemical vapour deposition process. The reactor described therein comprises a cylindrical plasma chamber with a substrate holder mounted on a base thereof. A cooling device is provided below the substrate holder for controlling the temperature of a substrate on the substrate holder. Furthermore, a gas inlet and a gas outlet are provided in the base of the plasma chamber for supplying and removing process gases. A microwave generator is coupled to the plasma chamber via a high-frequency coaxial line which is subdivided at its delivery end above the plasma chamber and directed at the periphery of the plasma chamber to an essentially ring-shaped microwave window in the form of a quartz ring. The invention as described in U.S. Pat. No. 6,645,343 focuses on the ring-shaped microwave window and discloses that the coupling of microwaves in the reactor chamber is distributed in rotationally symmetric fashion over the entire ring surface of the microwave window. It is taught that because the coupling is distributed over a large surface, high microwave power levels can be coupled without high electric field intensities developing at the microwave window thus reducing the danger of window discharge.

It light of the above discussion and the prior art mentioned therein, it will be evident that it is a well known aim in the field of CVD diamond synthesis to form a uniform, stable, large area plasma across the surface of a large area substrate/holder for achieving uniform CVD diamond growth over large areas and that many different plasma chamber designs and power coupling configurations have been proposed in the art for trying to achieve this goal. However, there is an on going need to improve upon the prior art arrangements in order to provide larger CVD growth areas, better uniformity, higher growth rates, better reproducibility, better power efficiency and/or lower production costs. It is an aim of certain embodiments of the present invention to address this on going need.

SUMMARY OF INVENTION

According to a first embodiment of the present invention there is provided a microwave plasma reactor for manufacturing synthetic diamond material via chemical vapour deposition, the microwave plasma reactor comprising:

a plasma chamber;
a substrate holder disposed in the plasma chamber and comprising a supporting surface for supporting a substrate on which the diamond film is to be deposited in use;
a microwave coupling configuration for feeding microwaves from a microwave generator into the plasma chamber; and
a gas flow system for feeding process gases into the plasma chamber and removing them therefrom;
wherein the microwave plasma reactor further comprises an electrically conductive plasma stabilizing annulus disposed around the substrate holder within the plasma chamber.

According to a second embodiment of the present invention there is provided a method of manufacturing synthetic diamond material using a chemical vapour deposition process, the method comprising:

providing a microwave plasma reactor as described above;
disposing a substrate over the supporting surface of the substrate holder, the substrate have a growth surface;
feeding microwaves into the plasma chamber;
feeding process gases into the plasma chamber; and
forming synthetic diamond material on said growth surface of the substrate.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 1:
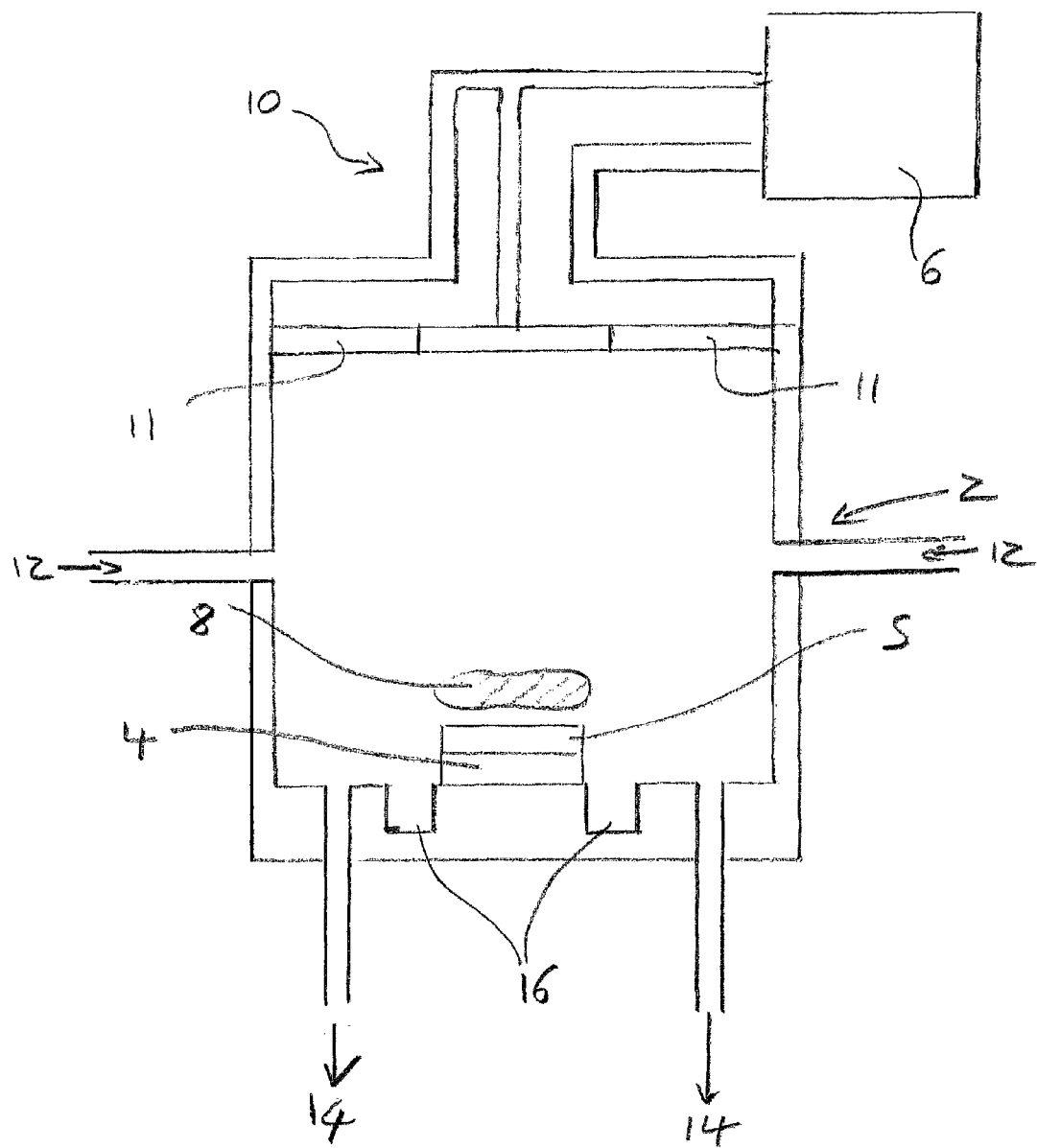
FIG. 1 shows a cross-sectional view of a microwave plasma reactor configured to deposit a diamond film using a chemical vapour deposition technique according to an embodiment of the present invention.

Microwave plasma reactors for manufacturing synthetic diamond material via chemical vapour deposition comprise the following basic components:

a plasma chamber;
a substrate holder disposed in the plasma chamber and comprising a supporting surface for supporting a substrate on which the diamond film is to be deposited in use;
a microwave coupling configuration for feeding microwaves from a microwave generator into the plasma chamber; and
a gas flow system for feeding process gases into the plasma chamber and removing them therefrom.

The plasma chamber is configured to form a resonance cavity supporting a standing microwave in use. Source gases including a carbon source and molecular hydrogen are fed into the plasma reactor vessel and can be activated by the standing microwave to form a plasma in high electric field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

Embodiments of the present invention are based on the finding that an electrically conductive plasma stabilizing annulus disposed around the substrate holder within the plasma chamber of a microwave plasma reactor can be used to stabilize a plasma formed adjacent a substrate disposed on substrate holder to form a uniform, stable, plasma over a large area for achieving uniform, high quality CVD diamond growth over large areas. By "electrically conductive" we mean that at least a majority, and optionally all, of the surface of the plasma stabilizing annulus is formed of an electrically conductive material. By "disposed around a substrate holder" we mean when viewed down a central axis of the plasma chamber, i.e. the electrically conductive plasma stabilizing annulus may be positioned at a height above or below the substrate holder.

Embodiments of the present invention are capable of providing larger CVD growth areas, better uniformity, higher growth rates, better reproducibility, better power efficiency and/or lower production costs. Without being bound by theory, modelling indicates that an electrically conductive plasma stabilizing annulus according to certain embodiments of the present invention modifies the electric field formed near the substrate, introducing a vertical asymmetry which increases the electric field above the substrate relative to the electric field at an opposite end of the plasma chamber where plasma formation is not desirable.

In addition, the electrically conductive plasma stabilizing annulus can function as a mode filter, aiding stability and/or purity of the electric field which drives the plasma. However, a well-designed clamp ring will make only a small modification to the electric field above the substrate (approximately +10% to the electric field above the substrate when present compared to when absent).

In addition to the above, the electrically conductive plasma stabilizing annulus according to certain embodiments can also significantly alter the thermal properties of the plasma which can aid in improving uniformity of CVD diamond growth.

Further still, the electrically conductive plasma stabilizing annulus according to certain embodiments can also interrupt gas flow up a side wall of the plasma chamber thereby reducing gas entrainment and unwanted convection currents within the chamber which would otherwise destabilize the inlet gas streams and/or the plasma.

Finally, the electrically conductive plasma stabilizing annulus according to certain embodiments can also function as a physical boundary to confine the plasma in use and prevent the plasma from deviating from an axially central location above the substrate.

Optionally, the substrate holder is disposed on an end of the plasma chamber and the electrically conductive plasma stabilizing annulus is disposed on said end of the plasma chamber or on a side wall of the plasma chamber around the substrate holder. Both these configurations, alone or in combination, may be utilized to modify the E-field above the substrate and achieve the advantageous functional effects outlined above. The most preferred configuration may depend, to some extent, on the plasma chamber size and geometry. For example, for plasma chambers having a large diameter (e.g. greater than 400 mm), an end mounted annulus may give superior performance in some circumstances.

Optionally, the electrically conductive plasma stabilizing annulus forms a complete continuous ring around the substrate holder. However, it is possible to achieve the advantageous functional effects outlined above without providing a complete continuous ring. For example, the electrically conductive plasma stabilizing annulus may comprise a plurality of arcuate segments and gaps therebetween, the plurality of arcuate segments forming a broken, discontinuous ring around the substrate holder. If such a discontinuous ring arrangement is provided, it is preferred that the plurality of arcuate segments extended around at least 30%, 40%, 50%, 60%, 70%, 80%, or 90% of the plasma stabilizing annulus. For example, it has been observed that a discontinuous ring configuration comprising two arcuate segments separated by two opposing gaps, each subtending approximately 20°, gives less than 1% difference in the electric field above the substrate between the lowest and highest field directions and there is no discernible non-uniformity in CVD diamond growth with such gaps. Indeed, the provision of such gaps can be useful to provide windows through which to observe the CVD diamond growth process.

Optionally, the electrically conductive plasma stabilizing annulus is symmetrical around a central axis of the plasma chamber. While small asymmetries may exist, larger asymmetries can lead to asymmetries in the electric field above the substrate resulting in non-uniformity in CVD diamond growth across the substrate. Furthermore, the electrically conductive plasma stabilizing annulus may take a continuous or discontinuous form as previously described. As such, the electrically conductive plasma stabilizing annulus may be circularly symmetric or have n-fold rotational symmetry.

The electrically conductive plasma stabilizing annulus may take two basic forms: a projecting ring which protrudes into the chamber from a wall of the plasma chamber; or a ring-shaped recess, moat, or channel formed in a wall of the plasma chamber. Either of these two basic forms of annulus may be provided on an end wall of the plasma chamber, on a side wall, or both. Optionally, more than one electrically conductive plasma stabilizing annulus may be provided.

Optionally, the electrically conductive plasma stabilizing annulus has a radial width relative to a diameter of the plasma chamber in the range 1% to 30%, 3% to 20%, 5% to 15%, or 8% to 12%. It has been found that the radial width of the plasma stabilizing annulus modifies the effect of the annulus on the plasma. Various radial widths have been modelled and tested. It has been found that increasing the radial width of the annulus increases the relative strength of the E-field above the plasma which is advantageous. However, if the radial width of the annulus becomes too large it tends to weaken the E-field above the substrate and increases the E-field in other regions of the plasma chamber which can be detrimental. For example, it has been found that for a plasma chamber having a diameter in the range 300 mm to 500 mm, the electrically conductive plasma stabilizing annulus may have a radial width in the range 5 to 100 mm, 5 mm to 80 mm, 10 mm to 50 mm, or 20 mm to 40 mm. These values are preferred for a microwave frequency f in the range 800 MHz to 1000 MHz. For a microwave frequency f in the range 400 MHz to 500 MHz, the plasma chamber may have a diameter in the range 600 mm to 1000 mm and the electrically conductive plasma stabilizing annulus may have a radial width in the range 10 mm to 165 mm, 20 mm to 100 mm, or 40mm to 80 mm. For a microwave frequency f in the range 2300 MHz to 2600 MHz, the plasma chamber may have a diameter in the range 100 mm to 200 mm and the electrically conductive plasma stabilizing annulus may have a radial width in the range 2 mm to 30 mm, 4 mm to 20 mm, or 6mm to 15 mm.

For the same reasons as given above, optionally the electrically conductive plasma stabilizing annulus may have an inner diameter relative to a diameter of the plasma chamber no less than 50%, 60%, 70%, 75%, or 80% and/or no more than 95%, 90%, 85%, or 80%. For example, the electrically conductive plasma stabilizing annulus may have an inner diameter relative to a diameter of the plasma chamber in the range 50% to 95%, 60% to 90%, 70% to 85%, or 75% to 80%. In use, the electrically conductive plasma stabilizing annulus may have an inner diameter relative to a diameter of visible plasma within the plasma chamber in the range 110% to 250%, 120% to 200%, 120% to 160%, or 130% to 150%. In terms of absolute values, the electrically conductive plasma stabilizing annulus may have an inner diameter no less than: 300 mm, 400 mm, 450 mm, or 500 mm for a microwave frequency f in the range 400 MHz to 500 MHz; 150 mm, 200 mm, 240 mm, or 280 mm for a microwave frequency f in the range 800 MHz to 1000 MHz; or 50 mm, 70 mm, 85 mm, or 95 mm for a microwave frequency f in the range 2300 MHz to 2600 MHz. Furthermore, the electrically conductive plasma stabilizing annulus may have an inner diameter no more than: 950 mm, 850 mm, 800 mm, 720 mm, or 680 mm for a microwave frequency f in the range 400 MHz to 500 MHz; 450 mm, 400 mm, 350 mm, or 330 mm for a microwave frequency f in the range 800 MHz to 1000 MHz; or 170 mm, 150 mm, 130 mm, or 120 mm for a microwave frequency f in the range 2300 MHz to 2600 MHz.

For example, it has been found that for a plasma chamber having a diameter in the range 300 mm to 500 mm, the electrically conductive plasma stabilizing annulus may have an inner diameter in the range 150 mm to 400 mm, 200 mm to 350 mm, or 240 mm to 330 mm. These values are preferred for a microwave frequency f in the range 800 MHz to 1000 MHz. For a microwave frequency f in the range 400 MHz to 500 MHz, the plasma chamber may have a diameter in the range 600 mm to 1000 mm and the electrically conductive plasma stabilizing annulus may have an inner diameter in the range 300 mm to 800 mm, 400 mm to 720 mm, or 500 mm to 680 mm. For a microwave frequency f in the range 2300 MHz to 2600 MHz, the plasma chamber may have a diameter in the range 100 mm to 200 mm and the electrically conductive plasma stabilizing annulus may have an inner diameter in the range 50 mm to 150 mm, 70 mm to 130 mm, or 85 mm to 120 mm.

Optionally, the electrically conductive plasma stabilizing annulus may have an axial depth relative to a height of the plasma chamber in the range 1% to 30%, 2% to 20%, or 5% to 15%. Additionally, or alternatively, the electrically conductive plasma stabilizing annulus may have an axial depth relative to a vertical distance between two electric field antinodes of the plasma chamber in the range 1% to 30%, 2% to 20%, or 5% to 15%. It has been found that the axial depth of the electrically conductive plasma stabilizing annulus also modifies the effect of the annulus on the plasma. Various axial depths have been modelled and tested. It has been found that increasing the axial depth of the annulus increases the relative strength of the E-field above the plasma which is advantageous. However, if the axial depth of the annulus becomes too large it can detrimentally affect the electric field in other regions of the plasma chamber. Accordingly, the electrically conductive plasma stabilizing annulus may have an axial depth in the range 5 mm to 100 mm, 5 mm to 75 mm, 10 mm to 50 mm, 20mm to 40 mm, or 20 mm to 30 mm. Such arrangements have been found to be particularly useful for a plasma chamber having a diameter in the range 300 mm to 500 mm operating at a microwave frequency f in the range 800 MHz to 1000 MHz. For a microwave frequency f in the range 400 MHz to 500 MHz, the plasma chamber may have a diameter in the range 600 mm to 1000 mm and the electrically conductive plasma stabilizing annulus may have an axial depth in the range 10 mm to 200 mm, 10 mm to 150 mm, 20 mm to 100 mm, 40mm to 80 mm, or 40 mm to 60 mm. For a microwave frequency f in the range 2300 MHz to 2600 MHz, the plasma chamber may have a diameter in the range 100 mm to 200 mm and the electrically conductive plasma stabilizing annulus may have an axial depth in the range 2 mm to 35 mm, 2 mm to 30 mm, 4 mm to 20 mm, 7 mm to 15 mm, or 7 mm to 10 mm.

Optionally, a lower surface of the electrically conductive plasma stabilizing annulus is positioned at a height equal to or less than 50%, 40%, 30%, 20% or 10% of a height of the plasma chamber from an end on which the substrate holder is disposed. It has been found that the positional location (height) of the electrically conductive plasma stabilizing annulus also modifies the effect of the annulus on the plasma. Various positions have been modelled and tested. It has been found that if the annulus is too high then the benefits of increasing plasma stability are not observed. Furthermore, in certain configurations, if the annulus is positioned too low relative to a supporting surface of the substrate holder, arcing can detrimentally occur. For example, it has been found that the electrically conductive plasma stabilizing annulus may be positioned such that a height of a lower surface of the annulus is at a height within 100 mm, 70 mm, 50 mm, 30 mm, 20 mm, or 10 mm of a height of the supporting surface of the substrate holder.

In relation to the above, it should be noted that it is possible to invert the reactor in use. For example, in standard usage, the substrate will be supported by the base of the chamber which will form the lower wall of the chamber relative to the earth. However, it is possible to invert the reactor such that the base of the chamber supporting the substrate will form the upper wall of the chamber relative to the earth.

In this arrangement, the height of the plasma chamber from an end on which the substrate holder is disposed would be measured in a downwards direction. In the inverted orientation gas flow towards the substrate may be parallel to principle thermally driven convection currents (which are in an upwards direction due to the large amount of heat generated in the plasma which is below the substrate in an inverted arrangement). This inverted arrangement may have some benefits for certain applications.

In addition to the height requirements specified above, it has also been found that the enclosed volume defined by the electrically conductive plasma stabilizing annulus can affect performance. The enclosed volume is the volume of a recessed annulus. For a projecting annulus, the enclosed volume is the volume of the plasma chamber which is disposed directly under the projecting annulus. For a wall mounted annulus this will be the volume under the annulus between the lower surface of the annulus, the side wall, and the base of the plasma chamber. The enclosed volume can be defined in terms of cross-sectional area given that the plasma stabilizing annulus is rotationally symmetric. This parameter is termed the enclosed cross-sectional area. For a microwave frequency f in the range 400 MHz to 500 MHz, the electrically conductive plasma stabilizing annulus may define an enclosed cross-sectional area in the range 200 $mm^2$ to 10000 $mm^2$, 500 $mm^2$ to 5000 $mm^2$, or 2000 $mm^2$ to 2500 $mm^2$. For a microwave frequency f in the range 800 MHz to 1000 MHz, the electrically conductive plasma stabilizing annulus may define an enclosed cross-sectional area in the range 50 $mm^2$ to 5000 mm$^2$, 200 mm$^2$ to 2000 mm$^2$, or 300 mm$^2$ to 1000 mm$^2$. For a microwave frequency f in the range 2300 MHz to 2600 MHz, the electrically conductive plasma stabilizing annulus may define an enclosed cross-sectional area in the range 10 mm$^2$ to 150 mm$^2$, 30 mm$^2$ to 125 mm$^2$, or 50 mm$^2$ to 100 mm$^2$.

The relative size of the electrically conductive plasma stabilizing annulus and the substrate or substrate holder can also affect functional performance. As such, optionally the electrically conductive plasma stabilizing annulus may have a radial width relative to a diameter of the substrate or substrate holder in the range 10% to 50%, 15% to 40%, 20% to 35%, or 25% to 30%. The substrate or substrate holder may have a diameter in the range: 165 mm to 415 mm, 185 mm to 375 mm, 205 mm to 375 mm, 205 mm to 330 mm, or 240 mm to 330 mm for a microwave frequency f in the range 400 to 500 MHz; 80 mm to 200 mm, 90 mm to 180 mm, 100 mm to 180 mm, 100 mm to 160, or 115 mm to 160 mm for a microwave frequency f in the range 800 to 1000 MHz; or 30 mm to 75 mm, 33 mm to 65 mm, 37 mm to 65 mm, 37 mm to 58 mm, or 42 mm to 58 mm for a microwave frequency f in the range 2300 to 2600 MHz.

For the same reasons, the electrically conductive plasma stabilizing annulus may have an inner diameter relative to a diameter of the substrate or substrate holder in the range 150% to 400%, 150% to 350%, or 200% to 320%.

Of course, it is possible to provide a substrate holder which is a different size to the substrate. If this is the case, the substrate holder will generally be larger than the substrate and the previously described dimensional relationships will be modified with respect to the substrate holder. For example, if the substrate holder is made larger than the substrate then the inner diameter of the plasma stabilizing annulus relative to the size of the substrate holder will be smaller than the previously discussed values, for example in the range 100% to 200%, 105% to 200%, or 105% to 150% of the substrate holder diameter.

It should also be noted that the substrate holder may be formed by the base of the plasma chamber. The use of the term "substrate holder" is intended to cover such variations. Furthermore, the substrate holder may comprise a flat supporting surface which is the same diameter (as illustrated) or larger than the substrate. For example, the substrate holder may form a large flat surface, formed by the chamber base or a separate component disposed over the chamber base, and the substrate may be carefully positioned on a central region of the flat supporting surface. In one arrangement, the supporting surface of the substrate holder may have further elements, for example projections or grooves, to align, and optionally hold, the substrate. Alternatively, no such additional elements may be provided such that the substrate holder merely provides a flat supporting surface over which the substrate is disposed.

So for we have described the basic dimensions and location of an electrically conductive plasma stabilizing annulus according to certain embodiments of the present invention, e.g. positional height, depth, radial width, and inner diameter including both absolute values and relative values with respect to other components within the plasma chamber. It has also been found that the cross-sectional shape of the electrically conductive plasma stabilizing annulus can affect how the annulus interacts with the electromagnetic field within the plasma chamber and thus how the annulus affects the plasma formed above the growth surface of the substrate in use. Advantageously, it has been found that the electrically conductive plasma stabilizing annulus may be formed so as to comprise a relatively smooth cross-sectional shape without any sharp edges to avoid undesirable perturbations to the electromagnetic field. For example, the annulus may comprise at least a portion having a curved cross-sectional shape with a radius of curvature in a range 1 mm to 40 mm, 2 mm to 30 mm, 3 mm to 20 mm, or 5 mm to 15 mm. In the case of a projecting ring-shaped annulus, the radially inner end portion of the annulus projecting into the plasma chamber may comprise the curved portion. The curved end portion may have a constant radius of curvature or have a varying radius of curvature. For example, the curved end portion may have at least two portions having a different radius of curvature. In this case, a first portion may, for example, have a radius of curvature in a range 10 mm to 40 mm, 10 mm to 30 mm, or 12 mm to 20 mm and a second portion may, for example, have a radius of curvature in a range 1 mm to 10 mm, 2 mm to 8 mm, or 3 mm to 7 mm. Advantageously, the portion having a larger radius of curvature is located closer to the substrate as highly curved or sharp edges located close to the substrate have been found to adversely affect the plasma during CVD diamond growth, although this adverse effect is reduced if the annulus is located at a significant distance from the substrate. In the case of a ring-shaped projecting annulus extending from a side wall of the plasma chamber, the annulus may have a substantially flat upper surface (which may be horizontal or disposed at an angle) and a curved radially-inner end portion which has an upper portion having a small radius of curvature and a lower portion having a larger radius of curvature. The lower curved portion may extend to the side wall of the chamber or a lower flat portion may be provided (which may be horizontal or disposed at an angle). It has been found that an annulus having such a cross-sectional shape is beneficial in achieving stable, uniform, large area plasmas without producing adverse perturbations within the plasma leading to non-uniform CVD diamond growth.

The electrically conductive plasma stabilizing annulus can be made of a material which is capable of withstanding the harsh thermal environment within the plasma chamber in use. Furthermore, the electrically conductive plasma stabilizing annulus may have sufficient electrical conductivity to interact and modify the electric field and/or sufficient thermal conductivity to modify the thermal properties of the plasma in use. These properties will depend to some extent on the process parameters used in the method of CVD diamond synthesis. However, for typical process temperatures and field strengths, the electrically conductive plasma stabilizing annulus may be formed of a material having a melting point of at least 100° C., an electrical conductivity of at least $1 \times 10^6$ Sm$^{-1}$, and/or a thermal conductivity of at least 10 WK$^{-1}$m$^{-1}$. Suitable materials include metallic materials. Examples include stainless steel, copper, aluminium, molybdenum, and tantalum. As such, the material may comprise at least 80%, 90%, 95%, or 98% of one or more of these materials. Accordingly to certain arrangements, the electrically conductive plasma stabilizing annulus is formed of the same material as a wall of the plasma chamber on which it is disposed. The electrically conductive plasma stabilizing annulus may be integrally formed by a portion of a wall of the plasma chamber or otherwise attached thereto by, for example, an electrically conductive join. The electrically conductive plasma stabilizing annulus may also be supplied with a coolant to avoid overheating.

The most preferred position, profile, and dimensions of the electrically conductive plasma stabilizing annulus will depend to some extent on the overall shape and dimensions of the plasma chamber and substrate. In one arrangement, the plasma chamber is substantially cylindrical and the electrically conductive plasma stabilizing annulus defines a circular cross-sectional shape which may be continuous or discontinuous as previously described. By substantially cylindrical we mean that at least 80% of a side wall of the plasma chamber has a circumference within 10% or 40 mm of a mean circle. The electrically conductive plasma stabilizing annulus may thus define a substantially circular shape having a circumference within 10% or 40 mm of a mean circle. Alternatively, the electrically conductive plasma stabilizing annulus may have a periodically varying internal diameter such that the annulus is non circular but has n-fold rotational symmetry, e.g. a polygonal annulus or one with a periodically varying curvature. In this case, n is preferably an odd number, most preferably a prime number such as 3, 5, or 7 to reduce adverse perturbations to the electromagnetic field.

According to one configuration the plasma chamber is configured to support a $TM_{01n}$ standing microwave in use, e.g. a cylindrical $TM_{011}$ mode. The plasma chamber may be configured to have a ratio of chamber height/chamber diameter in the range 0.3 to 1.0. Furthermore, the plasma chamber may be configured to have a ratio of chamber diameter/substrate (or substrate holder) diameter in the range 1.5 to 5, 2.0 to 4.5, or 2.5 to 4.0. Optionally, the inner diameter of the electrically conducting plasma stabilizing annulus may be selected according to the height of the plasma chamber such that a ratio of annulus inner diameter/plasma chamber height in the range 0.9 to 2, 0.95 to 1.8, 1.0 to 1.5, or 1.1 to 1.3.

A $TM_{011}$ mode will include two high electric field anti-nodes at either end of the chamber. The electrically conductive plasma stabilizing annulus may be position at or near one end of the chamber where the substrate holder is located so as to stabilize the high electric field anti-node adjacent a substrate mounted on the substrate holder in preference to the high electric field anti-node at the other end of the chamber.

The microwaves may be capacitively or inductively coupled into the plasma chamber. Inductive coupling has been found to be particularly useful in combination with the provision of an electrically conductive plasma stabilizing annulus as these features have been found to both reduce the possibility of electrical breakdown at the dielectric window. Optionally, a microwave coupling configuration may be arranged to inductively couple microwaves into the plasma chamber at an opposite end of the plasma chamber to that where the substrate holder and electrically conductive plasma stabilizing annulus are disposed. The microwave coupling configuration will typically comprise a waveguide for coupling microwaves from a generator into the plasma chamber through a dielectric window. In one arrangement, the dielectric window is positioned at or near an end of the plasma chamber opposite to an end of the plasma chamber where the substrate and electrically conductive plasma stabilizing annulus are located. As such, the electrically conductive plasma stabilizing annulus can be used to increase the electric field at the substrate end of the plasma chamber in preference to a high electric field region at an opposite end of the plasma chamber where the dielectric window is disposed. This has the advantageous technical effect of reducing damage of the dielectric window and avoiding electrical breakdown where the microwaves are coupled into the plasma chamber. Accordingly, the use of a bell-jar to constrain the plasma can be avoided according to certain embodiments. One possibility is to use a dielectric plate at an end of the plasma chamber opposite to the substrate. Another possibility is to couple the microwaves into the plasma chamber via a ring-shaped dielectric window. This may be arranged on a side wall as that describe in U.S. Pat. No. 6,645,343. However, it has been found to be advantageous to locate the ring-shaped dielectric window on an end wall opposite to the substrate holder and substrate.

The gas flow system is configured to feed process gases into the plasma chamber. One possibility is to configure the gas flow system to feed process gases into the plasma chamber at an opposite end of the plasma chamber to that where the substrate and electrically conductive plasma stabilizing annulus are disposed. For example, the gas flow system may be configured to inject process gases towards the growth surface of the substrate in an axial gas flow type arrangement. In this case, the electrically conductive plasma stabilizing annulus can aid in preventing gas entrainment due to process gas flowing back up the side walls of the plasma chamber and causing turbulence in the gas flow from the gas inlet. This can otherwise potentially cause non-uniformities in the CVD diamond growth process.

The previously described microwave plasma reactor has been found to be advantageous for synthesising CVD diamond material. The method of synthesising CVD diamond material comprises:
    providing a microwave plasma reactor as described;
    disposing a substrate over the supporting surface of the substrate holder, the substrate have a growth surface;
    feeding microwaves from a microwave generator into the plasma chamber;
    feeding process gases into the plasma chamber; and
    forming synthetic diamond material on said growth surface of the substrate.

Optionally, the electrically conductive plasma stabilizing annulus is positioned at a height, relative to a base of the plasma chamber, such that a lower surface of the annulus is within ±100 mm, 70 mm, 50 mm, 30 mm, 20 mm, or 10 mm of a height of the growth surface of the substrate. It has been found that in use, the position of the electrically conductive plasma stabilizing annulus relative to the growth surface can be important in to ensure that the plasma is stabilized at or near to the growth surface.

For example, the annulus may be positioned to have a lower edge approximately level with, or just above, the growth surface. Furthermore, the electrically conductive plasma stabilizing annulus may extend upwards adjacent to the plasma formed in use such that, for example, it has an axial depth in the range 1% to 100%, 10% to 75%, 20% to 50%, or 30% to 50% of an axial depth of visible plasma in the plasma chamber. In practice, the best results may be achieved when the electrically conductive plasma stabilizing annulus is positioned at a height which is aligned with a plasma formed within the plasma chamber in use. This will generally equate to a height just above the height of the growth surface of the substrate.

It has surprisingly been found that an electrically conductive plasma stabilizing annulus as described herein is particularly beneficial in enabling uniform deposition at high power and high pressure conditions. Typically the upper limit for uniform diamond synthesis in terms of the parameters pressure and power is determined by the onset of mono-polar arcs. Those skilled in the art will know that this mono-polar arc limit is affected by experimental factors such as the operating frequency, pressure/power ratio and also the geometry (diameter/thickness) of the substrate.

The present inventors found it surprising that an electrically conductive plasma stabilizing annulus as described herein increased the operating parameter space in terms of pressure and power while simultaneously not reducing the area of diamond deposition or the uniformity of said deposition. For example, using embodiments of the present invention it is possible to avoid the problem of arcing within the plasma chamber at operating pressures equal to or greater than: 200, 220, 240, 260, 280, 300, or 320 Torr at a microwave frequency in a range 2300 to 2600 MHz; 120, 140 160, 180, 200 or 220 Torr at a microwave frequency in a range 800 to 1000 MHz; or 60, 70, 80, 100 or 120 Torr at a microwave frequency in a range 400 to 500 MHz. The operating pressure may be equal to or less than 550, 450, 400, 350, or 300 Torr depending on the specific reactor design. For example, a typical operating pressure using an electrically conductive plasma stabilizing annulus according to certain embodiments of the present invention may be in the range 200 to 330 Torr for a microwave frequency in a range 2300 to 2600 MHz, 160 to 220 Torr for a microwave frequency in a range 800 to 1000 MHz, or 80 to 140 Torr for a microwave frequency in a range 400 to 500 MHz. Using embodiments of the present invention it has been found that it is possible to achieve a uniform stable plasma at these pressures and uniform CVD diamond growth.

Power densities which can be delivered to the substrate may be equal to or greater than 0.05, 0.1, 0.5, 1, 1.5, 2.0, 2.5, 2.75, 3.0, 3.2, or 3.5 W/mm$^2$ of the substrate growth surface. The power density may be equal to or less than 6.0, 5.0, or 4.0 W/mm$^2$ of the substrate growth surface depending on the specific reactor design. For example, a typical operating power density using an electrically conductive plasma stabilizing annulus according to certain embodiments of the present invention may be in the range 3.0 to 4.0 W/mm$^2$ of the substrate growth surface.

EXAMPLES

FIG. 1 shows an example of a microwave plasma reactor. The microwave plasma reactor comprises the following basic components: a plasma chamber 2; a substrate holder 4 disposed in the plasma chamber for supporting a substrate 5; a microwave generator 6 for forming a plasma 8 within the plasma chamber 2; a microwave coupling configuration 10 for feeding microwaves from the microwave generator 6 into the plasma chamber 2 via dielectric windows 11; and a gas flow system comprising a gas inlet 12 and a gas outlet 14 for feeding process gases into the plasma chamber 2 and removing them therefrom.

The plasma chamber 2 forms a tight microwave cavity with solid metal walls, preferably aluminium. The walls of the plasma chamber may be liquid or gas cooled (e.g. water cooled) to enable higher power operation. This aids in removing the requirement for a bell jar to constrain the reactive species, again allowing higher powers while also improving material purity.

The plasma chamber has been modified to include an electrically conductive plasma stabilizing annulus 16 in the form of a ring-shaped recess, moat, or channel disposed in an end wall of the plasma chamber around the substrate holder 4. In the illustrated embodiment the ring-shaped recess, moat or channel is shown with a substantially square or rectangular cross-sectional shape. However, in other arrangements the cross-sectional shape may be curved to have, for example, a hemispherical or substantially U-shaped cross-sectional shape. In further alternatives, the cross-sectional shape may be asymmetrical and may have, for example, a variable radius of curvature.

Figure 2:
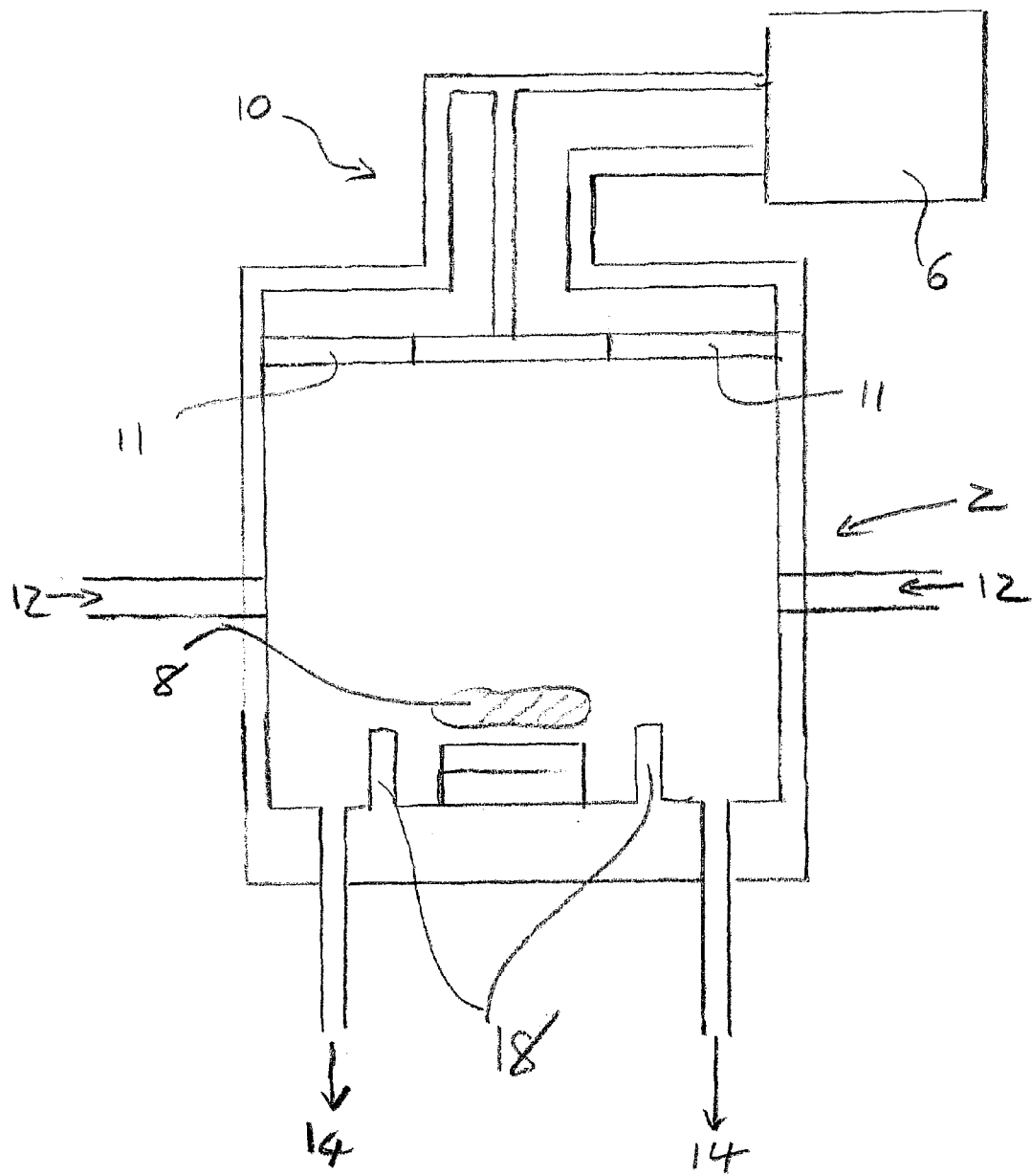
FIG. 2 shows a cross-sectional view of an alternative microwave plasma reactor configured according to an embodiment of the present invention.

FIG. 2 shows an alternative example in which the ring-shaped recess 16 of FIG. 1 has been replaced with a ring-shaped projection 18 disposed on the end wall of the plasma chamber around the substrate holder. In the illustrated embodiment the ring-shaped projection 18 is oriented in a vertical direction. However, another alternative is to modify the vertically oriented ring-shaped projection 18 to have a horizontal portion extending inwardly towards a central portion of the chamber. In such a configuration, the horizontal portion may have a radial width and inner diameter within the previously prescribed ranges for the annulus.

Figure 3:
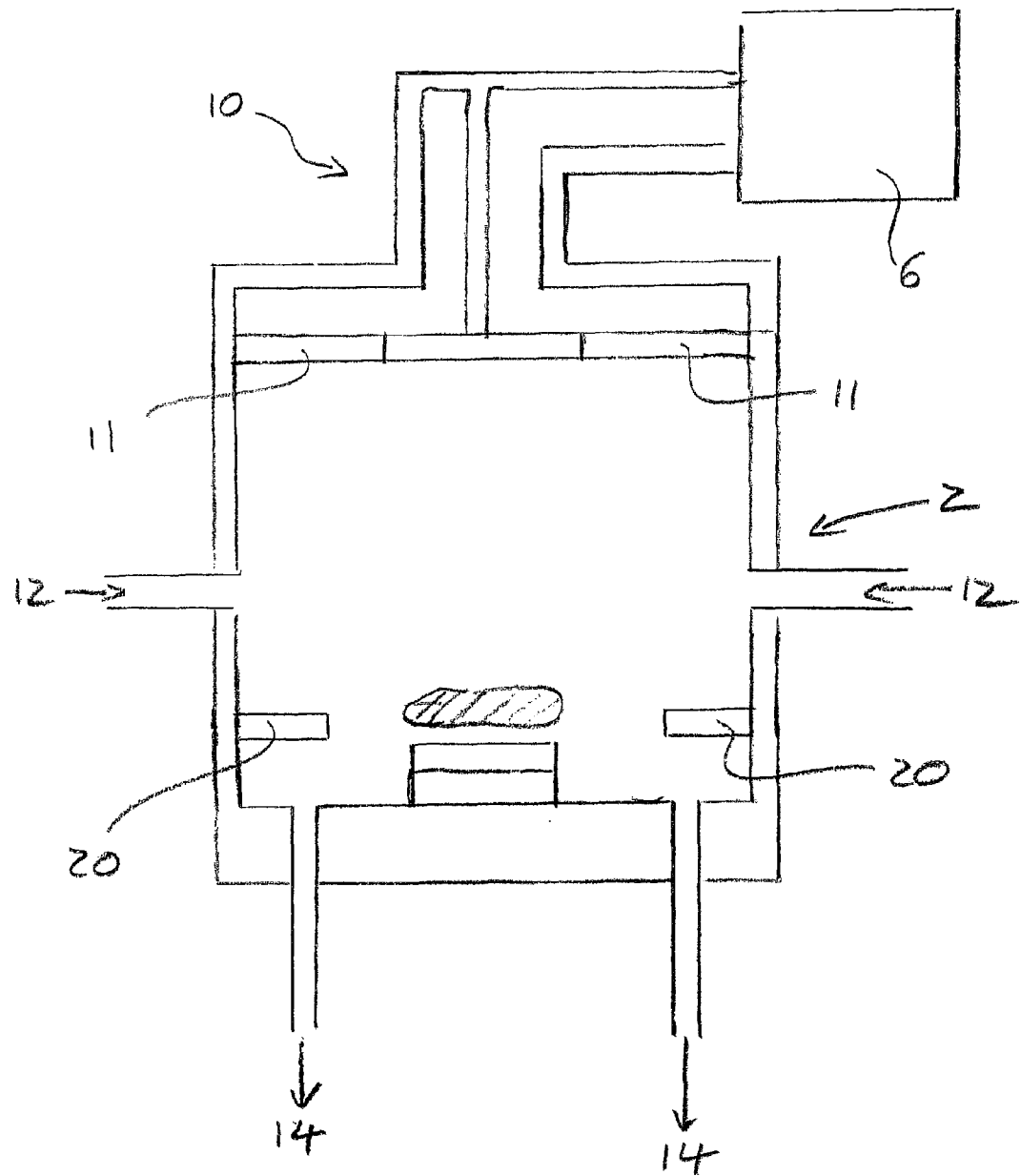
FIG. 3 shows a cross-sectional view of another alternative microwave plasma reactor according to an embodiment of the present invention.

FIG. 3 shows yet another alternative example in which ring-shaped projection 18 disposed on the end wall of the plasma chamber as illustrated in FIG. 2 as been replaced with a ring-shaped projection 20 disposed on a side wall the plasma chamber around the substrate holder.

In FIGS. 2 and 3, the ring-shaped projection 18 is shown with a substantial square or rectangular cross-sectional shape. However, in other arrangements the cross-sectional shape may be curved. For example, the ring-shaped projection 18 may have a curved end portion. In such an arrangement, the end portion may have a constant radius of curvature or it may be asymmetrical and have, for example, a variable radius of curvature.

Figure 4:
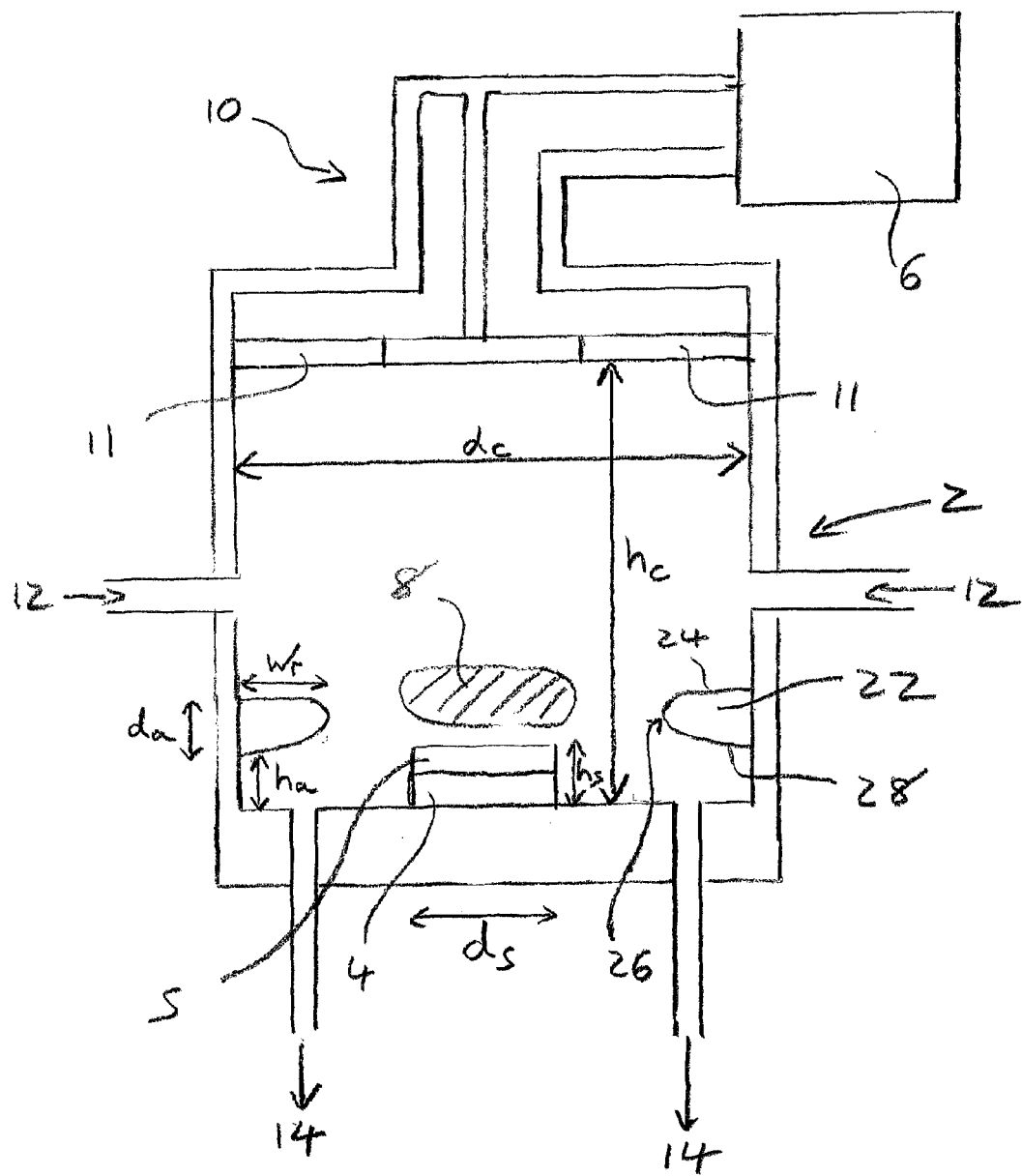
FIG. 4 shows a cross-sectional view of another alternative microwave plasma reactor according to an embodiment of the present invention.

FIG. 4 shows a microwave plasma reactor comprising another example of an electrically conductive plasma stabilizing annulus 22. This arrangement comprises a side-wall mounted arrangement similar to that shown in FIG. 3. However, in the arrangement illustrated in FIG. 4, the electrically conductive plasma stabilizing annulus 22 has an upper surface 24 which is substantially flat and a curved end portion 26 extending to a lower surface 28. The curved end portion 26 has a smaller radius of curvature in an upper portion and a larger radius of curvature in a lower portion of the electrically conductive plasma stabilizing annulus. It has been found that such a profile is particularly good at stabilizing the plasma 8 over the substrate 5 without incurring problematic perturbations to the electric field.

FIG. 4 also illustrates the dimensions discussed previously in this specification to avoid misinterpretation. The plasma chamber has a height $h_c$ and a diameter $d_c$. In the illustrated arrangement the substrate holder 4 and the substrate 5 have the same diameter $d_s$. However, it is also envisaged that these components may have different diameters. The substrate has a growth surface disposed at a height $h_s$ above the base of the plasma chamber. The electrically conductive plasma stabilizing annulus has a radial width $W_r$, an axial depth $d_a$, and an axial height $h_a$ above the base of the chamber.

Arrangements in which the electrically conductive plasma stabilizing annulus is mounted on a side wall projecting into the plasma chamber at a height approximately adjacent the growth surface of the substrate are particularly useful as, unlike moat-type arrangements which may only give some mode filtering functionality, a side projecting ring also aids in improving thermal management of the plasma and gas flow characteristics within the plasma chamber.

Embodiments of the present invention improve uniformity in a CVD diamond growth process. Improvement in uniformity can be measured by one or more of the following parameters: thickness uniformity of a CVD diamond film (across the deposition area); uniformity of one or more quality parameters of the diamond material (e.g. colour, optical properties, electronic properties, nitrogen uptake, boron uptake, and/or boron activation level); in polycrystalline diamond material, uniformity of texture, surface morphology, grain size, etc . . . ; or in single crystal diamond material where growth takes place on an array of single crystal diamond substrates on a substrate carrier, uniformity of thickness, morphology, edge twinning, lateral growth, etc . . . , between each single crystal. The key parameters chosen for assessing uniformity depend on the synthesis process, the economics of fabricating the final product from the synthesis product, and the requirements of the final product itself.

While this invention has been particularly shown and described with reference to preferred embodiments, it will be understood to those skilled in the art that various changes in form and detail may be made without departing from the scope of the invention as defined by the appendant claims.

The invention claimed is:

1. A microwave plasma reactor for manufacturing synthetic diamond material via chemical vapour deposition, the microwave plasma reactor comprising:
a plasma chamber;
a substrate holder disposed in the plasma chamber and comprising a supporting surface for supporting a substrate on which the synthetic diamond material is to be deposited in use;
a microwave coupling configuration for feeding microwaves from a microwave generator into the plasma chamber; and
a gas flow system for feeding process gases into the plasma chamber and removing them therefrom;
wherein the microwave plasma reactor further comprises an electrically conductive plasma stabilizing annulus disposed around the substrate holder within the plasma chamber when viewed down a central axis of the plasma chamber,
wherein the electrically conductive plasma stabilizing annulus is in the form of a projecting ring which protrudes into the plasma chamber from a side wall of the plasma chamber,
wherein the electrically conductive plasma stabilising annulus has an upper surface, a lower surface, and an end portion which forms the projecting ring which protrudes into the plasma chamber from the side wall of the plasma chamber,
wherein the upper surface of the electrically conductive plasma stabilising annulus is spaced apart from the a microwave coupling configuration, the electrically conductive plasma stabilizing annulus being positioned at a height within 50 mm, of a height of the supporting surface of the substrate holder, and
wherein the electrically conductive plasma stabilizing annulus has an axial depth relative to a height of the plasma chamber in the range 1% to 30%.

2. A microwave plasma reactor according to claim 1, wherein the electrically conductive plasma stabilizing annulus has a radial width relative to a diameter of the plasma chamber in the range 1% to 30%, 3% to 20%, 5% to 15%, or 8% to 12%.

3. A microwave plasma reactor according to claim 1, wherein the electrically conductive plasma stabilizing annulus has a radial width in a range: 10 mm to 165 mm, 20 mm to 100 mm, or 40 mm to 80 mm for a microwave frequency f in the range 400 MHz to 500 MHz; 5 mm to 100 mm, 10 mm to 50 mm, or 20 mm to 40 mm for a microwave frequency f in the range 800 MHz to 1000 MHz; or 2 mm to 30 mm, 4 mm to 20 mm, or 6 mm to 15 mm for a microwave frequency f in the range 2300 MHz to 2600 MHz.

4. A microwave plasma reactor according to claim 1, wherein the electrically conductive plasma stabilizing annulus has an inner diameter relative to a diameter of the plasma chamber no less than 50%, 60%, 70%, 75%, or 80%.

5. A microwave plasma reactor according to claim 1, wherein the electrically conductive plasma stabilizing annulus has an inner diameter relative to a diameter of the plasma chamber no more than 95%, 90%, 85%, or 80%.

6. A microwave plasma reactor according to claim 1, wherein the electrically conductive plasma stabilizing annulus has an inner diameter no less than: 300 mm, 400 mm, 450 mm, or 500 mm for a microwave frequency f in the range 400 MHz to 500 MHz; 150 mm, 200 mm, 240 mm, or 280 mm for a microwave frequency f in the range 800 MHz to 1000 MHz; or 50 mm, 70 mm, 85 mm, or 95 mm for a microwave frequency f in the range 2300 MHz to 2600 MHz.

7. A microwave plasma reactor according to claim 1, wherein the electrically conductive plasma stabilizing annulus has an inner diameter no more than: 950 mm, 850 mm, 800 mm, 720 mm, or 680 mm for a microwave frequency f in the range 400 MHz to 500 MHz; 450 mm, 400 mm, 350 mm, or 330 mm for a microwave frequency f in the range 800 MHz to 1000 MHz; or 170 mm, 150 mm, 130 mm, or 120 mm for a microwave frequency f in the range 2300 MHz to 2600 MHz.

8. A microwave plasma reactor according to claim 1, wherein the electrically conductive plasma stabilizing annulus has an inner diameter wherein a ratio of the inner diameter / plasma chamber height is in the range 0.9 to 2, 0.95 to 1.8, 1.0 to 1.5, or 1.1 to 1.3.

9. A microwave plasma reactor according to claim 1, wherein the axial depth of the electrically conductive plasma stabilizing annulus relative to a height of the plasma chamber is in the range 2% to 20%, or 5% to 15%.

10. A microwave plasma reactor according to claim 1, wherein the electrically conductive plasma stabilizing annulus has an axial depth relative to a vertical distance between two electric field antinodes of the plasma chamber in the range 1% to 30%, 2% to 20%, or 5% to 15%.

11. A microwave plasma reactor according to claim 1, wherein the electrically conductive plasma stabilizing annulus has an axial depth in a range: 10 mm to 200 mm, 10 mm to 150 mm, 20 mm to 100 mm, 40 mm to 80 mm, or 40 mm to 60 mm for a microwave frequency f in the range 400 MHz to 500 MHz; 5 mm to 100 mm, 5 mm to 75 mm, 10 mm to 50 mm, 20 mm to 40 mm, or 20 mm to 30 mm for a microwave frequency f in the range 800 MHz to 1000 MHz; or 2 mm to 35 mm, 2 mm to 30 mm, 4 mm to 20 mm, 7 mm to 15 mm, or 7 mm to 10 mm for a microwave frequency f in the range 2300 MHz to 2600 MHz.

12. A microwave plasma reactor according to claim 1, wherein the electrically conductive plasma stabilizing annulus is positioned to have a lower surface at a height equal to or less than 50%, 40%, 30%, 20% or 10% of a height of the plasma chamber from an end of the plasma chamber on which the substrate holder is disposed.

13. A microwave plasma reactor according to claim 1, wherein the height of the electrically conductive plasma stabilizing annulus is within 30 mm, 20 mm, or 10 mm of the height of the supporting surface of the substrate holder.

14. A microwave plasma reactor according to claim 1, wherein the electrically conductive plasma stabilizing annulus is formed of a material having a melting point of at least 100° C., an electrical conductivity of at least $1\times10^6$ $Sm^{-1}$, and/or a thermal conductivity of at least 10 $WK^{-1}m^{-1}$.

15. A microwave plasma reactor according to claim 14, wherein said material comprises at least 80%, 90%, 95%, or 98% of one or more of stainless steel, copper, aluminium, molybdenum, and tantalum.

16. A microwave plasma reactor according to claim 1, wherein the electrically conductive plasma stabilizing annulus comprises at least a portion having a curved cross-sectional shape with a radius of curvature in a range 1 mm to 40 mm, 2 mm to 30 mm, 3 mm to 20 mm, or 5 mm to 15 mm.

17. A microwave plasma reactor according to claim 16, where said portion has a varying radius of curvature including a lower portion which has a larger radius of curvature than an upper portion.

18. A microwave plasma reactor according to claim 17, wherein said lower portion has a radius of curvature in a range 10 mm to 40 mm, 10 mm to 30 mm, or 12 mm to 20 mm and said upper portion has a radius of curvature in a range 1 mm to 10 mm, 2 mm to 8 mm, or 3 mm to 7 mm.

19. A microwave plasma reactor according to claim 1, wherein the plasma chamber is configured such that the electrically conductive plasma stabilizing annulus is exposed to a plasma in use without any bell-jar between the plasma and the electrically conductive plasma stabilizing annulus.

* * * * *